US010049988B2

(12) United States Patent
Atherton

(10) Patent No.: US 10,049,988 B2
(45) Date of Patent: Aug. 14, 2018

(54) SEMICONDUCTOR DEVICE PACKAGE SUBSTRATE HAVING A FIDUCIAL MARK

(71) Applicant: NXP USA, INC., Austin, TX (US)

(72) Inventor: Steven A. Atherton, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/447,259

(22) Filed: Mar. 2, 2017

(65) Prior Publication Data
US 2017/0179038 A1 Jun. 22, 2017

Related U.S. Application Data

(62) Division of application No. 14/964,931, filed on Dec. 10, 2015, now Pat. No. 9,627,255.

(51) Int. Cl.
H01B 13/00 (2006.01)
H01L 23/544 (2006.01)
H01L 21/48 (2006.01)
H01L 23/498 (2006.01)
C23F 1/00 (2006.01)
H01L 21/768 (2006.01)
H01L 23/528 (2006.01)
H01L 23/532 (2006.01)
H01L 23/535 (2006.01)

(52) U.S. Cl.
CPC .............. H01L 23/544 (2013.01); C23F 1/00 (2013.01); H01L 21/4846 (2013.01); H01L 21/7685 (2013.01); H01L 21/76883 (2013.01); H01L 21/76885 (2013.01); H01L 23/49838 (2013.01); H01L 23/49866 (2013.01); H01L 23/49894 (2013.01); H01L 23/528 (2013.01); H01L 23/535 (2013.01); H01L 23/5329 (2013.01); H01L 2223/5442 (2013.01); H01L 2223/54426 (2013.01)

(58) Field of Classification Search
CPC ........... H01L 21/4846; H01L 21/76883; H01L 21/76885; H01L 23/544; H01L 23/49866
USPC .................................. 216/13, 14, 17, 18, 19
See application file for complete search history.

(56) References Cited

U.S. PATENT DOCUMENTS

| 5,942,805 | A | 8/1999 | Winer et al. | |
|---|---|---|---|---|
| 5,952,247 | A | 9/1999 | Livengood et al. | |
| 6,668,449 | B2 | 12/2003 | Rumsey et al. | |
| 7,786,390 | B2 * | 8/2010 | Ikeda | H05K 1/119 174/255 |
| 9,041,229 | B1 | 5/2015 | Johnson | |
| 2014/0083747 | A1 * | 3/2014 | Matsuno | H05K 1/0269 174/251 |
| 2015/0010854 | A1 * | 1/2015 | Seo | G03F 1/24 430/5 |

* cited by examiner

Primary Examiner — Binh X Tran

(57) ABSTRACT

A method for forming a semiconductor device package substrate including a fiducial mark is provided. The method of forming the package substrate includes forming a dielectric layer over a lower portion of the package substrate. A metal layer is formed over a fiducial region of the package substrate. The metal layer is etched to form a first signal line in the fiducial region. A passivation layer is formed over the first signal line. The passivation layer is etched over the first signal line to form a fiducial mark.

20 Claims, 3 Drawing Sheets

SEMICONDUCTOR DEVICE PACKAGE SUBSTRATE HAVING A FIDUCIAL MARK

This application is a divisional application of a U.S. patent application entitled "SEMICONDUCTOR DEVICE PACKAGE SUBSTRATE HAVING A FIDUCIAL MARK", having a serial number of Ser. No. 14/964,931, now U.S. Pat. No. 9,627,255 B1, having a filing date of Dec. 10, 2015, having common inventors, and having a common assignee, all of which is incorporated by reference in its entirety.

BACKGROUND

Field

This disclosure relates generally to semiconductor device package substrates, and more specifically, to fiducial marks on semiconductor device package substrates.

Related Art

Semiconductor device manufacturing generally accommodates very high volume run rates. To meet volume device packaging requirements, sophisticated automation equipment is used in the manufacturing process. For example, to manufacture a semiconductor device, one or more components may be attached to a substrate. The substrate with components attached may subsequently be encapsulated or partially encapsulated with a molding compound. Using automation equipment to place components onto a semiconductor device package substrate significantly speeds up the manufacturing process. The automation equipment takes advantage of visual or optical alignment aids located on the semiconductor device package substrate to place the components in their predetermined locations. Such alignment aids located on the semiconductor device package substrate are generally referred to as fiducial marks. While fiducial marks aid semiconductor device manufacturing, fiducial marks can consume valuable semiconductor device package substrate area.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package substrate that includes one or more fiducial marks. The one or more fiducial marks are formed over one or more active signals, reducing the amount of area typically consumed by fiducial marks. Because the one or more active signals no longer route around fiducial marks, routing congestion can be reduced. An opening exposing the one or more signals of a fiducial mark allows for probing of the one or more signals during debug, for example.

FIGS. 1-4 illustrate, in a simplified cross-sectional view, an exemplary semiconductor device package substrate 100 including a fiducial mark at various stages of manufacture in accordance with an embodiment of the present disclosure.

Figure 1:
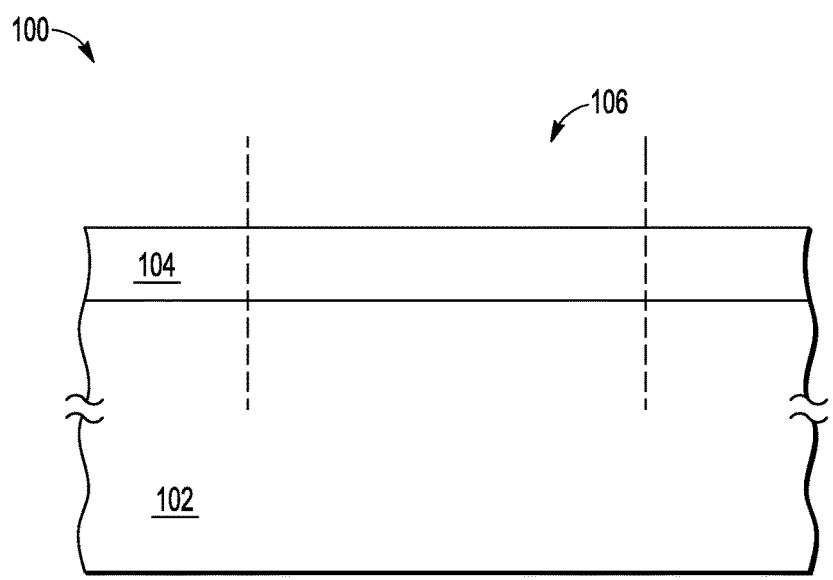
FIGS. 1-4 illustrate, in a simplified cross-sectional view, an exemplary semiconductor device package substrate at various stages of manufacture in accordance with an embodiment of the present disclosure.

FIG. 1 illustrates, in a simplified cross-sectional view, a stage of manufacture of an exemplary semiconductor device package substrate 100 including a fiducial mark region. The exemplary semiconductor device package substrate 100 includes a lower portion 102 of the package substrate, a dielectric layer 104, and a fiducial mark region 106. The lower portion 102 may include a multi-layer structure formed of any suitable electrically conductive material that is easy to pattern, such as aluminum, copper, nickel, or iron, or alloys including one or more of these materials. Each conductive material layer of the lower portion 102 may be isolated from other conductive material layers by one or more layers of an insulating material such as a dielectric material, for example. In some embodiments, the leadframe may be formed as conductive traces on a substrate such as ceramic or silicon, for example.

Dielectric layer 104 is formed over the lower portion 102. Dielectric layer 104 can include any suitable dielectric or insulating material such as a grown or deposited oxide material, for example. The dielectric layer 104 electrically isolates the lower portion 102 from subsequent conductive layers which are formed over the dielectric layer 104.

Fiducial mark region 106 is located between the vertical dashed lines shown in FIG. 1. In subsequent stages of manufacture, a fiducial mark is formed within the fiducial mark region 106. In general, fiducial marks are formed in strategic locations on the semiconductor device package substrate to assist automation equipment in placing components onto the semiconductor device package substrate 100. One or more fiducial regions 106 may be located on the semiconductor device package substrate 100.

Figure 2:
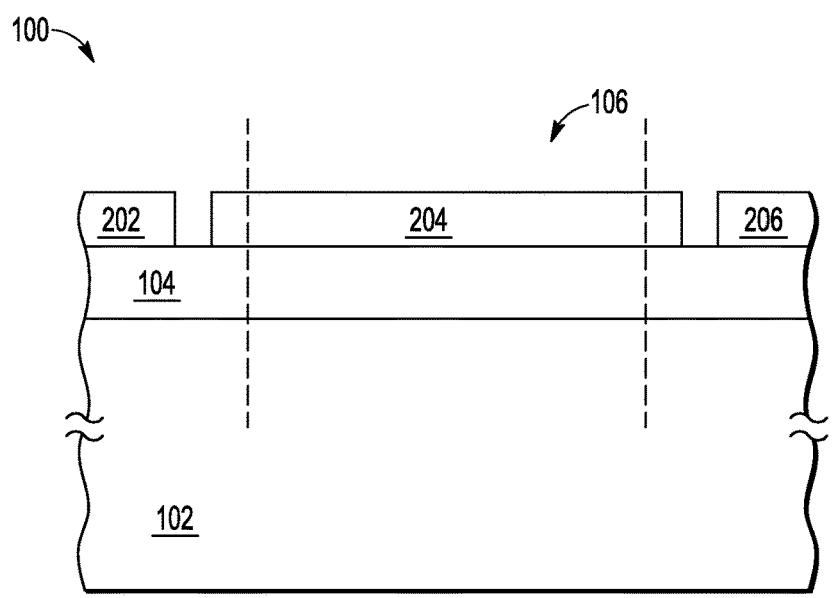

FIG. 2 illustrates, in a simplified cross-sectional view, a subsequent stage of manufacture of the exemplary semiconductor device package substrate 100 including a plurality of metal lines. A patterned metal layer is formed over dielectric layer 104 forming signal line 204 with neighboring signal lines 202 and 206. The patterned metal layer may be formed of any suitable electrically conductive material that is easy to pattern, such as copper, aluminum, nickel, or iron, or alloys including one or more of these materials. In this embodiment, signal lines 202 and 206 are neighboring supply conductor lines such as VDD and ground, for example.

Figure 3:
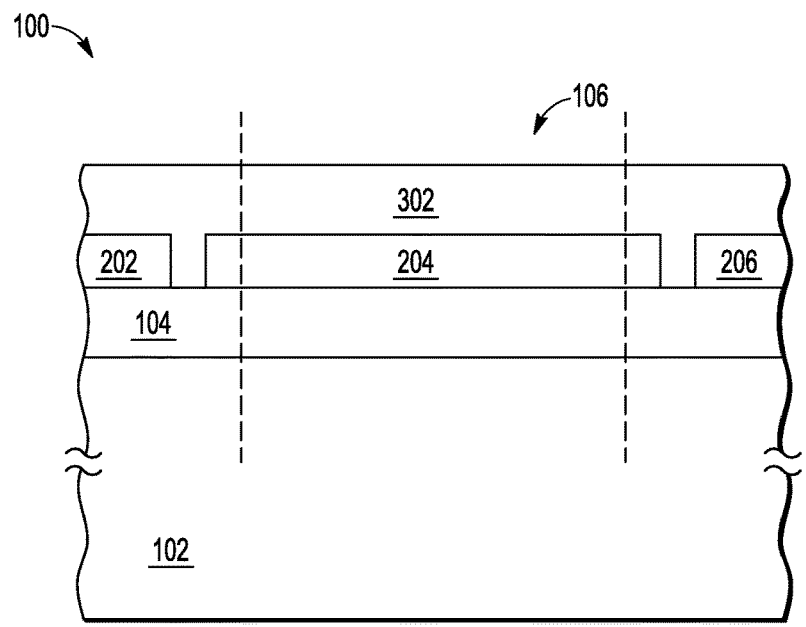

FIG. 3 illustrates, in a simplified cross-sectional view, a subsequent stage of manufacture of the exemplary semiconductor device package substrate 100 including a passivation layer 302. A passivation layer 302 is formed over the patterned metal layer. Passivation layer 302 can be formed of any suitable dielectric or insulating material such as a grown or deposited oxide or nitride material, for example. The passivation layer 302 can protect the underlying patterned metal layer from corrosion, for example, by preventing corrosive environmental elements from directly contacting the underlying patterned metal layer.

Figure 4:
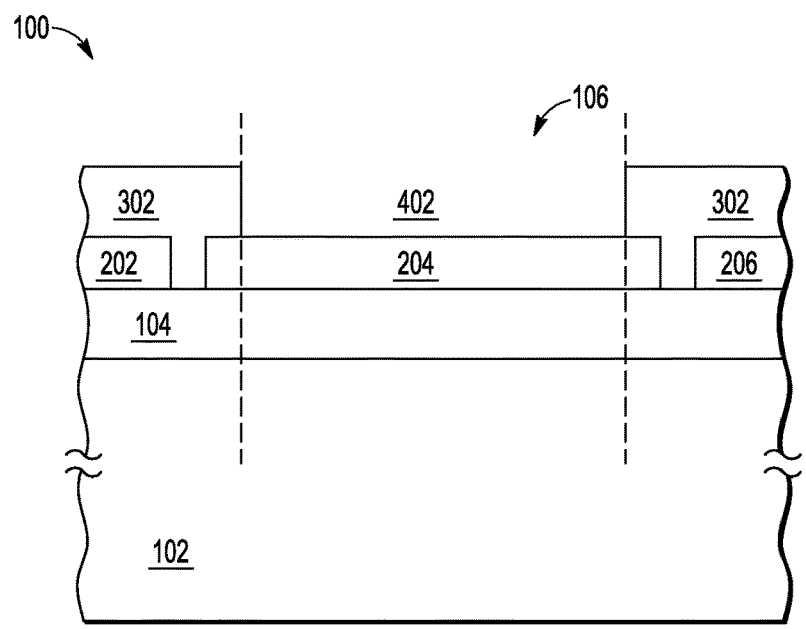

FIG. 4 illustrates, in a simplified cross-sectional view, a subsequent stage of manufacture of the exemplary semiconductor device package substrate 100 including a passivation layer opening 402. The opening 402 is formed in the passivation layer 302 exposing a top surface of signal line 204 in the patterned metal layer at fiducial mark region 106. The opening 402 may be formed in any shape or size, the shape and size generally determined by recognition requirements of instruments or equipment which utilizes fiducial marks. The opening 402 may be formed by any suitable etch process such as a wet etch or plasma etch process, for example. The exposed top surface of signal line 204 at opening 402 forms a fiducial mark. The exposed metal of the fiducial mark, when irradiated with light, is significantly more reflective than metal covered by passivation layer 302. Because the fiducial mark is more reflective, it is more discernable from other shapes and features of the semiconductor device package substrate 100. The fiducial mark can be used by automation equipment as an alignment aid, for example, when assembling components onto the semiconductor device package substrate 100. The exposed top surface of the signal line 204 allows for the signal line to be probed by a mechanical probe or an electron-beam probe, for example, as a debug aid. Because the opening 402 is formed over a signal line, overall signal routing area can be reduced. In some embodiments, the opening 402 may be formed over a plurality of signal lines which can be probed.

Still referring to FIG. 4, in some embodiments where the opening 402 is formed over a plurality of signal lines, a conductive material may be deposited in the opening 402 to form a conduction path between the plurality of signal lines. For example, if the opening 402 exposed a top surface of two adjacent signal lines, then a deposited conductive material in the opening could effectively short the two signals together. This may be useful when configuring features for a product during manufacturing or configuring a debug condition for the product, for example.

Figure 5:
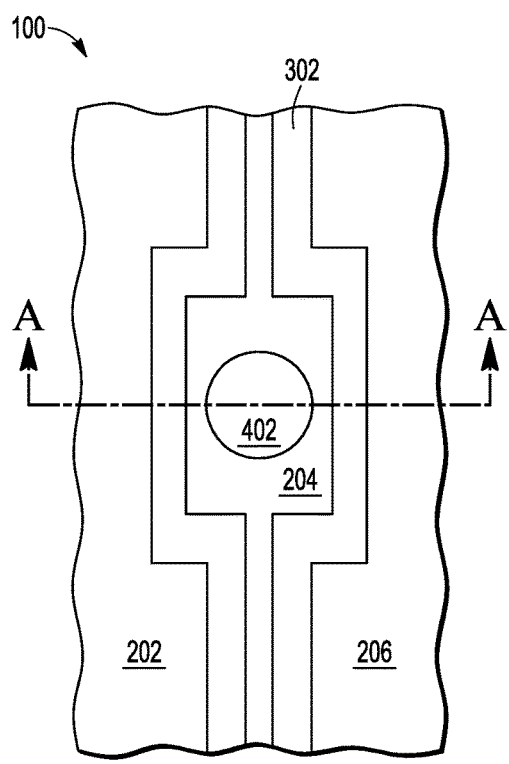
FIG. 5 illustrates, in a plan view form, the semiconductor device package substrate including a fiducial mark, shown in FIG. 4, in accordance with an embodiment of the present disclosure.

FIG. 5 illustrates, in a simplified plan view form, the semiconductor device package substrate including a fiducial mark, shown in FIG. 4, in accordance with an embodiment of the present disclosure. The cross-sectional views of FIGS. 1-4 are taken at section line A-A of the exemplary semiconductor device package substrate 100. A patterned metal layer is formed over dielectric layer forming signal line 204 with neighboring signal lines 202 and 206. The patterned metal layer may be formed of any suitable electrically conductive material that is easy to pattern, such as copper, aluminum, nickel, or iron, or alloys including one or more of these materials. In this embodiment, signal lines 202 and 206 are neighboring supply conductor lines such as VDD and ground, for example. A passivation layer 302 is formed over the patterned metal layer including signal lines 202, 204, and 206. Passivation layer 302 can be formed of any suitable dielectric or insulating material such as a grown or deposited oxide material, for example. The passivation layer 302 can protect the underlying patterned metal layer from corrosion, for example, by preventing environmental elements from contacting the patterned metal layer. An opening 402 is formed in the passivation layer 302 exposing a top surface of signal line 204 in the patterned metal. The opening 402 may be formed by any suitable etch process such as a wet etch or plasma etch process, for example. The exposed top surface of signal line 204 at opening 402 forms the fiducial mark.

Figure 6:
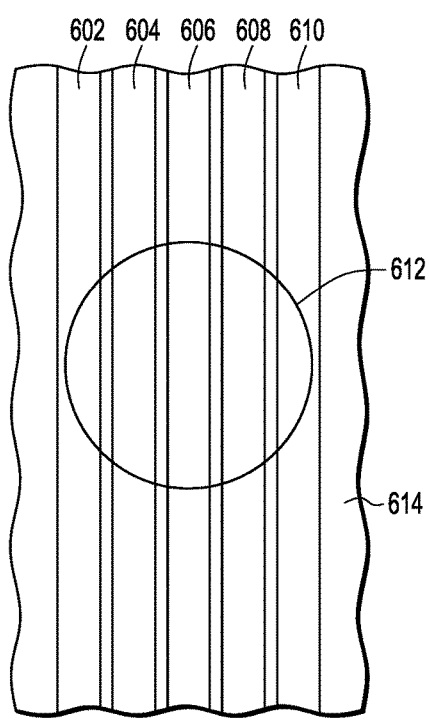
FIG. 6 illustrates, in a plan view form, another exemplary semiconductor device package substrate including a fiducial mark in accordance with an embodiment of the present disclosure.

FIG. 6 illustrates, in a simplified plan view form, another exemplary semiconductor device package substrate including a fiducial mark in accordance with an embodiment of the present disclosure. In this embodiment, a patterned metal layer is formed over a dielectric layer forming signal lines 602-610. The patterned metal layer may be formed of any suitable electrically conductive material that is easy to pattern, such as copper, aluminum, nickel, or iron, or alloys including one or more of these materials. In this embodiment, a plurality of signal lines 602-610 are nominally pitched, having typical widths and spaces of routed signals. A passivation layer 614 is formed over the patterned metal layer including signal lines 602-610. Passivation layer 614 can be formed of any suitable dielectric or insulating material such as a grown or deposited oxide material, for example. The passivation layer 614 can protect the underlying patterned metal layer from corrosion, for example, by preventing corrosive environmental elements from contacting the underlying patterned metal layer. An opening 612 is formed in the passivation layer 614 exposing a top surface of signal lines 604-608 and a portion of signal lines 602 and 610 in the patterned metal. The opening 612 may be formed by any suitable etch process such as a wet etch or plasma etch process, for example. The exposed top surface of signal lines 604-608 and a portion of signal lines 602 and 610 at opening 612 forms the fiducial mark. Because the plurality of signal lines 602-610 can be routed through a fiducial region, routing congestion can be improved.

By now, it should be appreciated that a semiconductor device package substrate that includes one or more fiducial marks has been provided. The one or more fiducial marks are formed over one or more active signals, reducing the amount of area typically consumed by fiducial marks. Because the one or more active signals can be routed through the fiducial mark region, routing congestion can be reduced. An opening exposing the one or more signals of a fiducial mark allows for probing of the one or more signals during debug, for example.

Generally, there is provided, a method of forming a package substrate including: forming a dielectric layer over a lower portion of the package substrate; forming a metal layer over a fiducial region of the package substrate; etching the metal layer to form a first signal line in the fiducial region; forming a passivation layer over the first signal line; and etching the passivation layer over the first signal line to form a fiducial mark. The etching the metal layer may further include forming a second signal line on a first side of the fiducial region and a third signal line on a second side of the fiducial region. The first signal line may have an extension portion outside the fiducial region, and the first signal line may be wider in the fiducial region than in the extension portion. The fiducial region may have a bottom fully covered by the first signal line. The etching the metal layer may be further characterized as forming a second signal line in the fiducial region. The etching the metal layer may be further characterized as forming a third signal line in the fiducial region. The first signal line may be between the second signal line and the third signal line. The passivation layer may include oxide. The passivation layer may further include nitride.

In another embodiment, there is provided, a package substrate including: a dielectric layer over a lower portion of the package substrate; a signal line over a fiducial region of the package substrate; and a passivation layer over the first signal line with an opening over a portion of the first signal whereby a fiducial mark is formed. The package substrate may further include a second signal line on a first side of the fiducial region and a third signal line (206) on a second side of the fiducial region. The first signal line may have an extension portion outside the fiducial region, and the first signal line may be wider in the fiducial region than in the extension portion. The fiducial region may have a bottom fully covered by the first signal line. The package substrate may further include a second signal line in the fiducial region. The package substrate may further include a third signal line in the fiducial region. The first signal line may be between the second signal line and the third signal line. The passivation layer may include oxide. The passivation layer may further include nitride.

In yet another embodiment, there is provided a fiducial mark in a package substrate including: a first signal line over a lower portion of the package substrate; and a passivation layer over the first signal line and the package substrate having an opening exposing a portion of the first signal line. The fiducial mark may be further characterized by one of a group consisting of: a second signal line having a portion in the opening; and the first signal line completely covering a bottom of the opening.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a package substrate, comprising:
   forming a dielectric layer over a lower portion of the package substrate;
   forming a metal layer over the dielectric layer;
   etching the metal layer to form a first signal line, the first signal line at least partially located at a fiducial region;
   forming a passivation layer over the first signal line; and
   etching the passivation layer to form an opening at the fiducial region over the first signal line, the opening forming a fiducial mark at least partially formed by the first signal line.

2. The method of claim 1, wherein the etching the metal layer further comprises:
   forming a second signal line proximate to a first side of the first signal line at the fiducial region and a third signal line proximate to a second side of the first signal line at the fiducial region.

3. The method of claim 1, wherein the first signal line has an extension portion outside the fiducial region, wherein the first signal line is wider in the fiducial region than in the extension portion.

4. The method of claim 1, wherein the fiducial region has a bottom fully covered by the first signal line.

5. The method of claim 1, wherein the etching the metal layer is further characterized as forming a second signal line in the fiducial region.

6. The method of claim 5, wherein the etching the metal layer is further characterized as forming a third signal line in the fiducial region.

7. The method of claim 6, wherein the first signal line is between the second signal line and the third signal line.

8. The method of claim 1, wherein the passivation layer comprises oxide.

9. The method of claim 8, wherein the passivation layer further comprises nitride.

10. A method of forming a package substrate including a fiducial mark, comprising:
    forming a fiducial region at the package substrate;
    forming a dielectric layer over a lower portion of the package substrate;
    forming a metal layer over the dielectric layer;
    etching the metal layer to form a first signal line at least partially located at the fiducial region;
    forming a passivation layer over the first signal line; and
    etching the passivation layer to form an opening over the first signal line at the fiducial region, the fiducial mark at least partially formed by the opening and at least partially formed by the first signal line.

11. The method of claim 10, wherein the etching the metal layer further comprises:
    forming a second signal line on a first side of the fiducial region and a third signal line on a second side of the fiducial region.

12. The method of claim 10, wherein the first signal line has an extension portion outside the fiducial region, wherein the first signal line is wider in the fiducial region than in the extension portion.

13. The method of claim 10, wherein the fiducial region has a bottom fully covered by the first signal line.

14. The method of claim 10, wherein the metal layer comprises copper or aluminum.

15. The method of claim 10, wherein the passivation layer comprises oxide.

16. The method of claim 10, wherein the etching the metal layer is further characterized as forming a second signal line over the dielectric layer, the second signal line at least partially located at the fiducial region, wherein the opening in the passivation layer at the fiducial region is further over the second signal line, and wherein the fiducial mark is further at least partially formed by the second signal line.

17. The method of claim 16, further comprising depositing a conductive material in the opening at the fiducial region to form a conduction patch between the first signal line and the second signal line.

18. The method of claim 16, wherein the etching the metal layer is further characterized as forming a third signal line over the dielectric layer, the third signal line at least partially located at the fiducial region, wherein the opening in the passivation layer at the fiducial region is further over the third signal line, and wherein the fiducial mark is further at least partially formed by the third signal line.

19. The method of claim 18, wherein the first signal line is between the second signal line and the third signal line.

20. A method of forming a package substrate including a fiducial mark, comprising:
  forming a fiducial region at the package substrate;
  forming a dielectric layer over a lower portion of the package substrate;
  forming a metal layer over the dielectric layer;
  etching the metal layer to form a first signal line and a second signal line, the first signal line and the second signal line at least partially located at the fiducial region;
  forming a passivation layer over the first signal line;
  etching the passivation layer over the first signal line to form an opening at the fiducial region, the fiducial mark at least partially formed by the opening, first signal line, and the second signal line; and
  depositing a conductive material in the opening at the fiducial region to form a conduction path between the first signal line and the second signal line.

\* \* \* \* \*